United States Patent
Takahashi et al.

(10) Patent No.: US 11,846,015 B2
(45) Date of Patent: Dec. 19, 2023

(54) SB—TE-BASED ALLOY SINTERED COMPACT SPUTTERING TARGET

(71) Applicant: JX Nippon Mining & Metals Corporation, Tokyo (JP)

(72) Inventors: Hideyuki Takahashi, Ibaraki (JP); Yoshimasa Koido, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 0 days.

(21) Appl. No.: 16/522,876

(22) Filed: Jul. 26, 2019

(65) Prior Publication Data

US 2020/0017955 A1 Jan. 16, 2020

Related U.S. Application Data

(63) Continuation of application No. 13/521,148, filed as application No. PCT/JP2011/059814 on Apr. 21, 2011, now abandoned.

(30) Foreign Application Priority Data

Apr. 26, 2010 (JP) ................. 2010-101156

(51) Int. Cl.
| | |
|---|---|
| *C23C 14/34* | (2006.01) |
| *C22C 28/00* | (2006.01) |
| *C23C 14/06* | (2006.01) |
| *C22C 1/04* | (2023.01) |
| *C04B 35/547* | (2006.01) |

(Continued)

(52) U.S. Cl.
CPC ........ *C23C 14/3414* (2013.01); *C04B 35/547* (2013.01); *C04B 35/6261* (2013.01);

(Continued)

(58) Field of Classification Search
CPC .................................. C23C 14/3414
See application file for complete search history.

(56) References Cited

U.S. PATENT DOCUMENTS

| | | |
|---|---|---|
| 6,238,494 B1 | 5/2001 | Segal |
| 7,803,209 B2 | 9/2010 | Takahashi |

(Continued)

FOREIGN PATENT DOCUMENTS

| | | |
|---|---|---|
| JP | H10-081962 A | 3/1998 |
| JP | 2000-129316 A | 5/2000 |

(Continued)

*Primary Examiner* — John J Brayton
(74) *Attorney, Agent, or Firm* — HOWSON & HOWSON LLP

(57) ABSTRACT

An Sb—Te-based alloy sintered compact sputtering target having Sb and Te as main components and which contains 0.1 to 30 at % of carbon or boron and comprises a uniform mixed structure of Sb—Te-based alloy particles and fine carbon (C) or boron (B) particles is provided. An average grain size of the Sb—Te-based alloy particles is 3 μm or less and a standard deviation thereof is less than 1.00. An average grain size of the C or B particles is 0.5 μm or less and a standard deviation thereof is less than 0.20. When the average grain size of the Sb—Te-based alloy particles is X and the average grain size of the carbon or boron particles is Y, Y/X is within a range of 0.1 to 0.5. This provides an improved Sb—Te-based alloy sputtering target that inhibits generation of cracks in the sintered target and prevents generation of arcing during sputtering.

8 Claims, 2 Drawing Sheets

(51) Int. Cl.
*C22C 12/00* (2006.01)
*C04B 35/626* (2006.01)
*C04B 35/645* (2006.01)
*G11B 7/26* (2006.01)

(52) U.S. Cl.
CPC .............. *C04B 35/645* (2013.01); *C22C 1/04* (2013.01); *C22C 12/00* (2013.01); *C22C 28/00* (2013.01); *C23C 14/0623* (2013.01); *G11B 7/266* (2013.01); *C04B 2235/40* (2013.01); *C04B 2235/404* (2013.01); *C04B 2235/408* (2013.01); *C04B 2235/421* (2013.01); *C04B 2235/422* (2013.01); *C04B 2235/428* (2013.01); *C04B 2235/5436* (2013.01); *C04B 2235/5445* (2013.01); *C04B 2235/77* (2013.01); *C04B 2235/785* (2013.01); *C04B 2235/96* (2013.01)

(56) References Cited

U.S. PATENT DOCUMENTS

| | | | |
|---|---|---|---|
| 7,943,021 B2 | 5/2011 | Takahashi | |
| 7,947,106 B2 | 5/2011 | Takahashi | |
| 8,268,433 B2 | 9/2012 | Tsuchino et al. | |
| 2003/0207112 A1 | 9/2003 | Yadav | |
| 2005/0031484 A1* | 2/2005 | Nonaka | C23C 14/3414 420/579 |
| 2007/0297938 A1 | 12/2007 | Takahashi | |
| 2009/0014318 A1* | 1/2009 | Khang | C23C 14/3414 204/192.15 |
| 2009/0301872 A1* | 12/2009 | Yahagi | C22C 12/00 204/298.13 |
| 2010/0206724 A1 | 8/2010 | Takahashi | |
| 2011/0017590 A1 | 1/2011 | Fukuyo et al. | |
| 2012/0097530 A1 | 4/2012 | Takahashi | |
| 2012/0286219 A1 | 11/2012 | Ikisawa et al. | |

FOREIGN PATENT DOCUMENTS

| | | | |
|---|---|---|---|
| JP | 2000-169960 A | | 6/2000 |
| JP | 2000-265262 A | | 9/2000 |
| JP | 2001098366 A | * | 4/2001 |
| JP | 2001-123266 A | | 5/2001 |
| JP | 2001-123267 A | | 5/2001 |
| JP | 2001-098366 A | | 10/2001 |
| JP | 2004-162109 A | | 6/2004 |
| JP | 2004-363541 A | | 12/2004 |

* cited by examiner

[Fig. 1]
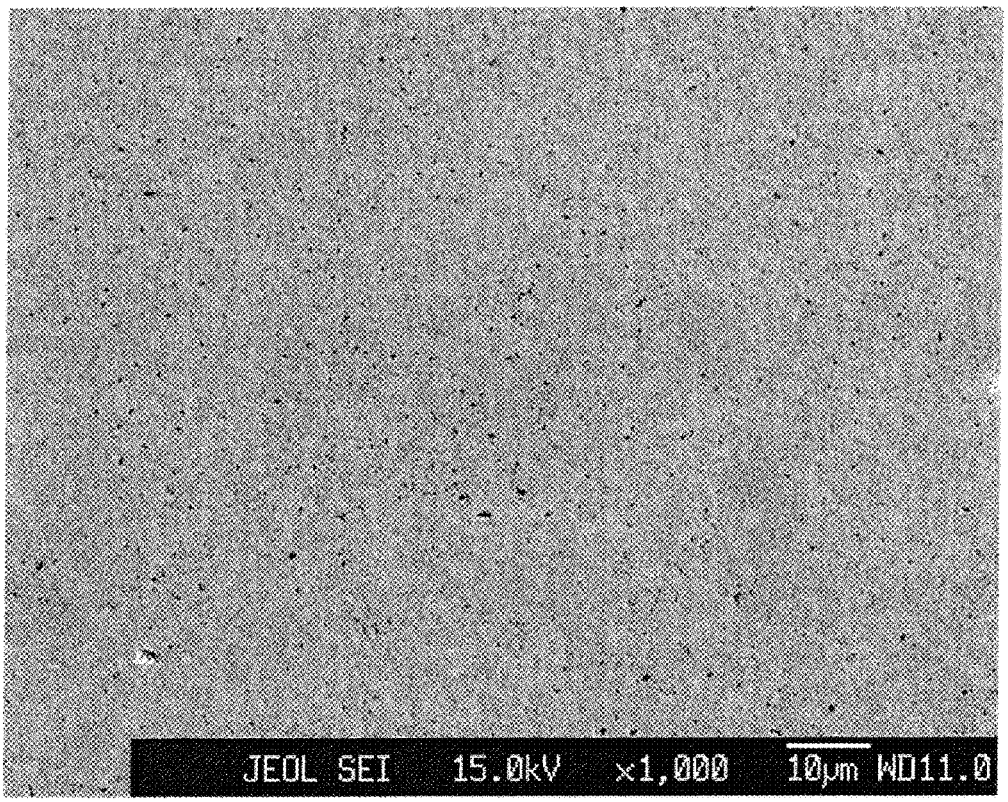
[Fig. 2]
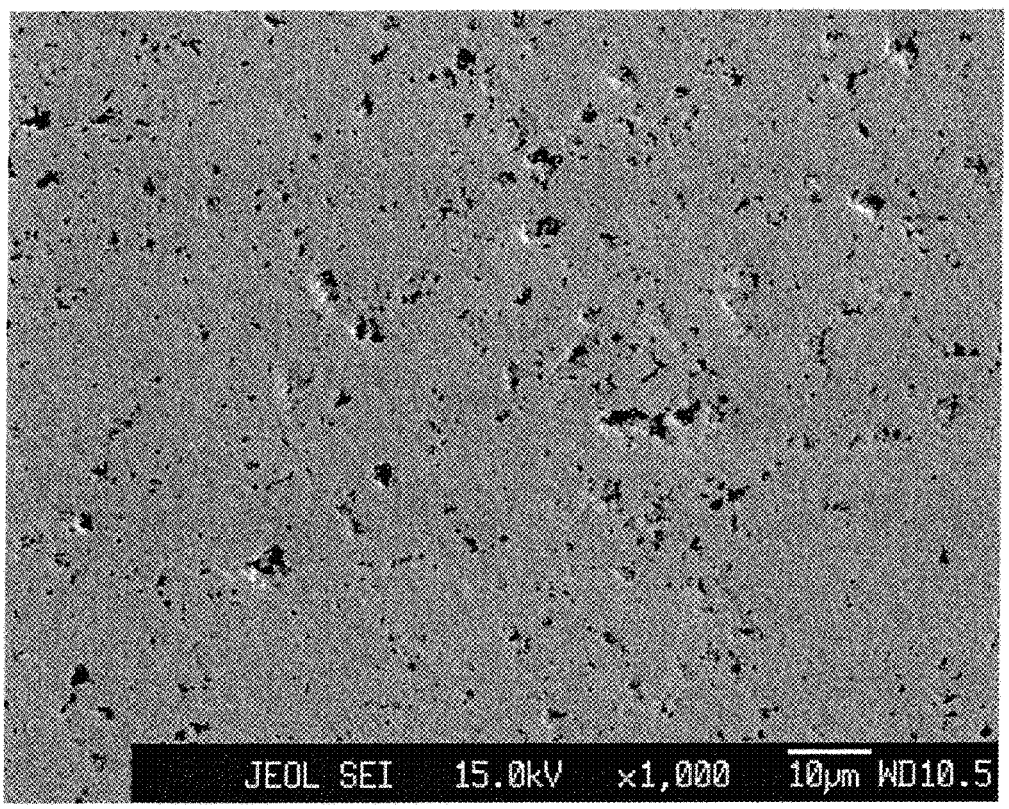

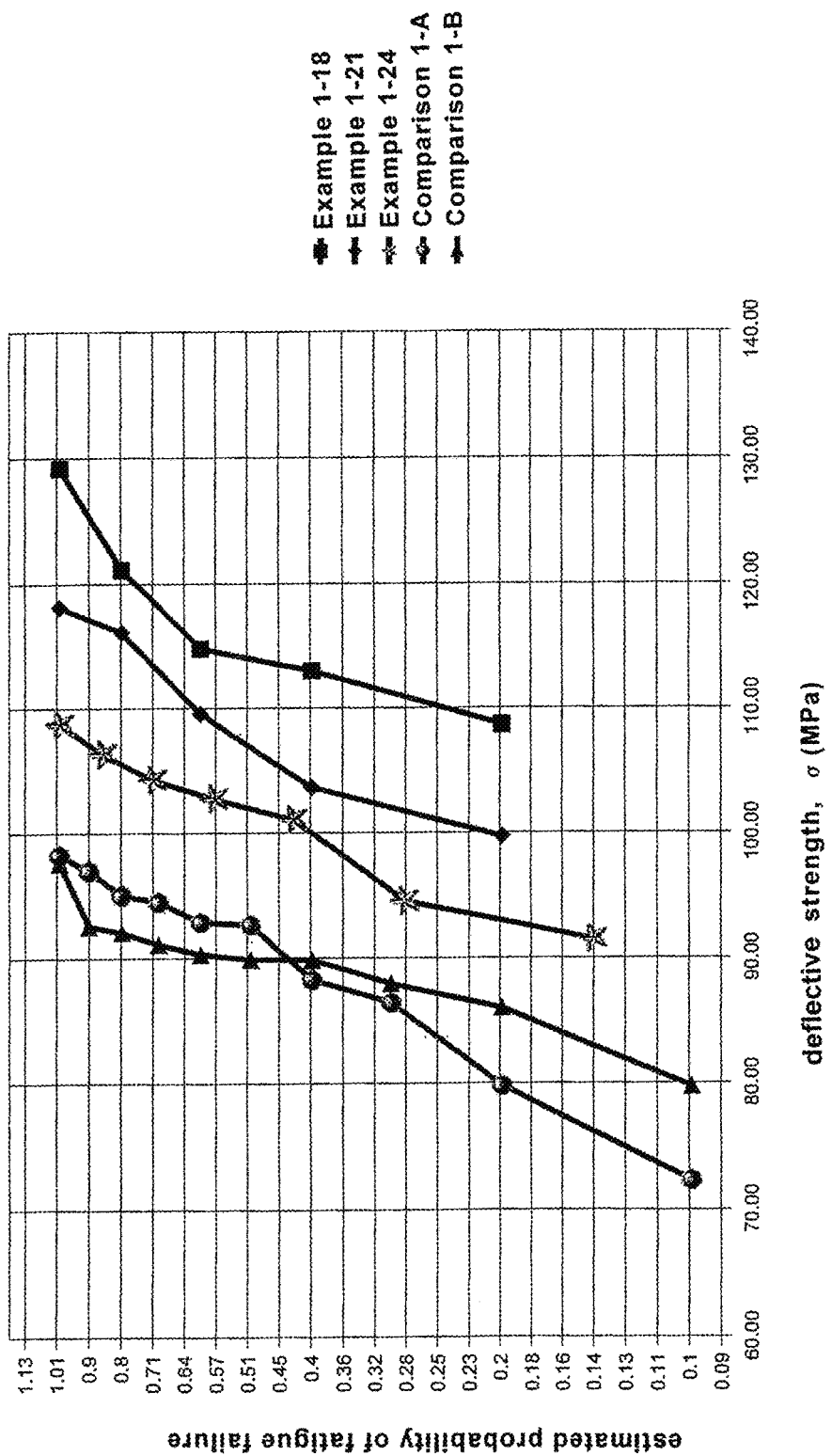

SB—TE-BASED ALLOY SINTERED COMPACT SPUTTERING TARGET

CROSS REFERENCE TO RELATED APPLICATIONS

This application is a continuation of co-pending U.S. application Ser. No. 13/521,148 which is a 371 National Stage of International Application No. PCT/JP2011/059814, filed Apr. 21, 2011, which claims the benefit under 35 USC 119 of Japanese Application No. 2010-101156, filed Apr. 26, 2010.

BACKGROUND

The present invention relates to an Sb—Te-based alloy sintered compact sputtering target containing carbon or boron and capable of effectively inhibiting the generation of particles.

In recent years, a thin film formed from an Sb—Te-based material is being used as a material for use in phase change recording; that is, as a medium for recording information by using phase transformation. As a method of forming this thin film formed from the Sb—Te-based alloy material, it is standard to use a means generally referred to as a physical vapor deposition method such as the vacuum deposition method or the sputtering method. In particular, the thin film is often formed using the magnetron sputtering method from the perspective of operability and film stability.

Formation of films by way of the sputtering method is performed by physically colliding positive ions such as Ar ions to a target disposed on a cathode, using that collision energy to discharge materials configuring the target, and laminating a film having roughly the same composition as the target material on the opposite anode-side substrate.

The coating method based on the sputtering method is characterized in that it is possible to form films of various thicknesses; for instance, from a thin film of angstrom units to a thick film of several ten μm with a stable deposition rate by adjusting the processing time, power supply and the like.

When forming a film formed from an Sb—Te-based alloy material for use in a phase change recording film, particularly problematic are the generation of abnormal structures such as nodules (abnormal projections) and craters (abnormal recesses) on the target surface, generation of micro arcing (abnormal discharge) based on the foregoing abnormal structures, and the inclusion of such abnormal structures in the form of clusters (cluster of atoms) referred to as particles in the thin film.

Other problems include the generation of cracks or fractures in the target in the sputtering process, unevenness of the formed thin film, and the absorption of large amounts of gas components such as oxygen in the production process of sintered powder for use in a target which affects the film quality of the sputtered film.

These problems encountered in targets and in the sputtering process will become a significant cause of deteriorating the quality and yield of the thin film as the recording medium.

It is known that the foregoing problems are largely affected by the grain size of the sintering powder or the target structure or shape. However, conventionally, it was not possible to avoid the generation of particles, abnormal discharge (arcing), and nodules and craters on the target in the sputtering process, generation of cracks or fractures in the target during the sputtering process, and the inclusion of large amounts of gas components such as oxygen contained in the target since the target obtained from the sintering is unable to retain sufficient characteristics upon producing an Sb—Te-based alloy sputtering target for forming a phase change recording layer.

As a conventional production method of an Sb—Te-based sputtering target, disclosed is a production method of a Ge—Sb—Te-based sputtering target of preparing powder of Ge—Te alloy and Sb—Te alloy by way of quenching based on the inert gas atomization method, evenly mixing alloys wherein the ratios are Ge/Te=1/1 and Sb/Te=0.5 to 2.0, and thereafter performing pressure sintering (for instance, refer to Japanese Unexamined Patent Application Publication No. 2000-265262).

In addition, there is a document that describes technology pertaining to the method of producing a Ge—Sb—Te-based sputtering target and a method of producing powder to be used therein by way of the atomization method including the steps of pouring powder in which the tap density (relative density) is 50% or higher among the alloy powders containing Ge, Sb, and Te, performing cold or hot pressurization thereto, and by sintering a molding material in which the density after the cold pressurization is 95% or higher via heat treatment in an Ar or vacuum atmosphere, wherein the oxygen content of the sintered compact is 700 ppm or less (for instance, refer to Japanese Unexamined Patent Application Publication No. 2001-98366).

In addition, there is a document that describes a method of producing a Ge—Sb—Te-based sputtering target material by preparing powder from a raw material containing Ge, Sb, and Te by way of quenching based on the inert gas atomization method, and using powder among the foregoing powder having a grain size distribution of 20 μm or greater and in which the specific surface area per unit weight is 300 $mm^2/g$ or less, and sintering a compact obtained by performing cold or hot pressure molding (for instance, refer to Japanese Unexamined Patent Application Publication No. 2001-123266).

As other technologies of producing a target using atomized powder, there are the following Japanese Unexamined Patent Application Publication No. H10-81962, Japanese Unexamined Patent Application Publication No. 2001-123267, and Japanese Unexamined Patent Application Publication No. 2000-129316.

Nevertheless, the foregoing Patent Documents use the atomized powder as is, and it is not possible to obtain a sufficient strength of the target, and it cannot be said that the refinement and homogenization of the target structure have been achieved. In addition, there is a problem in that it is insufficient as an Sb—Te-based sputtering target for forming a phase change recording layer.

Moreover, there is also known a sputtering target for forming an optical disk recording film in which the surface oxide film or the processing layer is eliminated, and the centerline average roughness Ra as the surface roughness is ≤1.0 μm (refer to Japanese Unexamined Patent Application Publication No. 2000-169960). The object of this target is to shorten the pre-sputtering time or to eliminate the pre-sputtering process entirely, and this method is extremely effective for achieving this object.

Nevertheless, with recent DVDs and BDs (Blu-ray Discs), even higher densification is being achieved, and, in order to improve the production yield, it is extremely important to reduce the particles caused by the target.

Accordingly, in addition to the shortening of the pre-sputtering process, it is necessary to improve the quality of the overall target and not just the surface of the target in order to effectively inhibit the generation of particles, abnormal discharge, and nodules, and the generation of cracks or fractures in the target.

Moreover, recently there have been proposals of increasing the electrical resistance of the phase change recording film, reducing the current value flowing in the writing and erasing operation, and reducing the power consumption in order to alleviate the burden on the circuit. As one such method, a proposal has been made for mixing carbon powder into the sputtering target to achieve high resistance (refer to Japanese Unexamined Patent Application Publication No. 2004-363541).

However, if carbon is mixed into a conventional Sb—Te-based alloy sputtering target, it will rather become an addition of foreign matter since carbon powder is non-metal; this will easily generate abnormal discharge in the sputtering process, the generation of particles will increase, and, in certain cases, cracks will occur in the target. There is a problem in that this is not necessarily a favorable additive.

In light of the foregoing circumstances, the present inventors developed an Sb—Te-based alloy sintered compact sputtering target having Sb and Te as its primary component comprising a structure where fine carbon or boron particles encompass the periphery of Sb—Te-based alloy particles, and, wherein, if the mean diameter of the Sb—Te-based alloy particles is X and the particle size of carbon or boron is Y, Y/X is within the range of 1/10 to 1/10000 (refer to International Publication No. WO2008-044626).

This is innovative technology from the perspective of being able to inhibit the generation of particles, abnormal discharge (arcing), and nodules, as well as the generation of cracks or fractures of the target.

Nevertheless, with this technology, carbon or boron powder was adhered to the surface of the Sb—Te-based alloy powder or its cluster by using airflow or the like, and the diffusion of carbon powder or boron powder inside the cluster was insufficient. In addition, there was a problem in that the carbon powder or boron powder would become a cluster and deteriorate the uniformity, and there was still room for improvement in this respect. The present invention is an improvement of the foregoing technology.

SUMMARY

The present invention provides an Sb—Te-based alloy sintered compact target added with carbon or boron for forming the phase change recording layer capable of overcoming the various problems described above; namely, a target that is capable of effectively inhibiting the generation of particles, abnormal discharge (arcing) and nodules and the generation of cracks and fractions in the target in the sputtering process. In particular, the present invention provides an Sb—Te-based alloy sintered compact sputtering target for forming a phase change recording layer formed from Ag—In—Sb—Te alloy or Ge—Sb—Te alloy.

As a technical means for overcoming the foregoing problems, the present inventors discovered that it is necessary to devise the shape of the powder and structure and characteristics of the target in order to obtain a stable and homogenous phase change recording layer. Specifically, the Sb—Te-based alloy powder configuring the target is refined, and the uniformity in the dispersion of the mutual position and shape of the carbon powder or boron powder is improved. In addition, based on the improvement in the uniformity and refinement, the mechanical strength of the target will improve, whereby stable sputtering is realized.

Based on the foregoing discovery, the present invention provides an Sb—Te-based alloy sintered compact sputtering target having Sb and Te as its main component and which contains 0.1 to 30 at % of carbon or boron and comprises a uniform mixed structure of Sb—Te-based alloy particles and fine carbon (C) or boron (B) particles, wherein the average grain size of the Sb—Te-based alloy particles is 3 µm or less and the standard deviation thereof is less than 1.00, the average grain size of C or B is 0.5 µm or less and the standard deviation thereof is less than 0.20, and, when the average grain size of the Sb—Te-based alloy particles is X and the average grain size of carbon or boron is Y, Y/X is within the range of 0.1 to 0.5.

The Sb—Te-based alloy sintered compact sputtering target may containing, at a maximum, 30 at % of one or more types of elements selected from Ag, In, Si, Ge, Ga, Ti, Au, Pt, and Pd. In addition, the target may be used for forming a phase-change recording layer formed from Ag—In—Sb—Te alloy or Ge—Sb—Te alloy containing carbon or boron, and the average deflective strength of the target may be 100 MPa or higher.

Since the Sb—Te-based alloy sintered compact of the present invention is able to inhibit abnormal structures such as lumps (coarse grains), which are clumps of the added carbon or boron which is nonmetal, it yields a superior effect of preventing abnormal discharge with such carbon or boron as the source, inhibit the generation of particles caused by arcing, and additionally improving the uniformity of the sputtered film.

Machining such as cutting work is performed at the stage of finishing the target, if there is coarsened carbon or boron, there is a possibility that cracks and the like will occur with such carbon or boron as the source, and the generation of particles with cracks as the source could also be considered, and the present invention is able to achieve a considerable effect of preventing the foregoing problems from occurring.

BRIEF DESCRIPTION OF THE DRAWINGS

FIG. 1 shows an SEM photograph of the target surface of Example 1.

FIG. 2 shows an SEM photograph of the target surface of the Comparative Example.

FIG. 3 shows a diagram of the mechanical strength of the Ge—Sb—Te alloy upon adding 15 at % of C.

DETAILED DESCRIPTION

The present invention uses an Sb—Te-based alloy powder obtained by pulverizing Sb—Te-based alloy using a jet mill or the like, as well as carbon (C) or boron (B) powder, mechanically mixing the foregoing powders, and thereafter sintering the same to obtain a sintered compact sputtering target. A vibrational mill, planetary ball mill or the like may also be used in substitute for the foregoing jet mill.

Upon performing the foregoing mixing, as needed, a mixer such as a blade mixer, mortar, or ball mill may be used. The mixer desirably comprises a mechanism of being able to destroy the clusters and physically kneading C or B therein.

Generally, jet mill pulverization of the Sb—Te-based alloy powder is able to achieve an extremely fine powder compared to the gas atomized powder or the machine pulverized powder, and is characterized in being able to prevent contamination caused by the use of a pulverizer. A target that is sintered using the jet mill pulverized powder yields superior characteristics compared to machine pulverized powder as described later.

As described above, the use of jet mill pulverized powder is a preferred mode. Nevertheless, so as long as the conditions of the present invention are satisfied, there is no particular problem in using machine pulverized powder other than jet mill pulverized powder. Upon performing machine pulverization, it is desirable to perform such machine pulverization in an inert atmosphere in order to reduce the oxygen content. A vibratory ball mill or the like may be used for the machine pulverization.

A significant feature of the Sb—Te-based alloy sintered compact sputtering target of the present invention is that it comprises a structure where Sb—Te-based alloy particles and fine carbon (C) or boron (B) particles are uniformly mixed.

Carbon or boron is contained in an amount of 0.1 to 30 at %. The average grain size of the Sb—Te-based alloy particles is 3 µm or less, and the standard deviation is less than 1.00. Moreover, the average grain size of C or B is 0.5 µm or less, and the standard deviation is less than 0.20.

Moreover, when the average grain size of the Sb—Te-based alloy particles is X and the average grain size of carbon or boron is Y, Y/X is within the range of 0.1 to 0.5. Incidentally, the average grain size of carbon or boron shall include the grain size of clustered carbon or boron.

The foregoing target conditions are essential conditions in order to favorably inhibit the generation of particles, abnormal discharge (arcing), nodules, as well as the generation of cracks or fractures of the target in the sputtering process. As a result of sputtering a target comprising the foregoing conditions, it is possible to form a film that is more uniform compared to conventional films.

In particular, the ratio of the diameter of the Sb—Te-based alloy particles and the grain size of carbon or boron is important in relation to the generation of particles. An optimal condition for this ratio, if Y/X is within the range of 0.1 to 0.5, an effect is yielded in significantly inhibiting the generation of arcing and particles.

It should be easy to understand that the following conditions; namely, carbon or boron is contained in an amount of 0.1 to 30 at %, the average crystal grain size of the Sb—Te-based alloy particles is 3 µm or less and the standard deviation thereof is less than 1.00, and the average grain size of C or B is 0.5 µm or less and the standard deviation thereof is less than 0.20 are important requirements in order to realize Y/X=0.1 to 0.5.

In cases where Y/X exceeds ½, the effect of inhibiting the generation of arcing and particles is low and the sinterability is also inferior, and problems such as fractures will arise due to the resulting low density. Moreover, if Y/X is less than 0.1, producing the target will be difficult since the carbon powder or boron powder will fall below the minimum size in which such powders can be separated and dispersed with this technology.

Accordingly, it is preferable to keep the values to be within the foregoing range. The Sb—Te-based alloy particles preferably have the required grain size in light of the balance with the grain size of carbon or boron. It is more preferable to be of a uniform structure where the average crystal grain size of the Sb—Te-based alloy particles is 3 µm or less and the standard deviation thereof is less than 1.00.

In many cases, coarsened Sb—Te-based alloy particles contain small Sb—Te-based alloy particles, and the mixture of coarsened Sb—Te-based alloy particles and small Sb—Te-based alloy particles will cause an uneven structure. Thus, such unevenness will similarly cause the generation of arcing and particles.

Moreover, by reducing the crystal grain size of the target, it is possible to keep the surface of the eroded target smooth even after the erosion, and there is an advantage of inhibiting the adhesion, of redepositions onto the unevenness arising on the eroded surface, such redepositions growing into nodules, and the generation of particles caused by the collapse of such nodules.

In addition, when producing a target based on the foregoing conditions, the selection and mixture of carbon or boron and the adjustment of the production conditions of their sintered compact are important. However, so as long as the average grain size of the Sb—Te-based alloy particles is 3 µm or less, the standard deviation thereof is less than 1.00, the average grain size of C or B is 0.5 µm or less and the standard deviation thereof is less than 0.20, and Y/X can be adjusted to be within a range of 0.1 to 0.5, it should be understood that there is no particular limitation on the foregoing production process.

Consequently, a preferable condition is using jet mill powder as the raw material of the Sb—Te-based alloy sintered compact excluding carbon or boron for the foregoing reasons. In addition, it is desirable that the content of the carbon or boron to be added is 0.1 to 30 at %. If the additive content is less than 0.1 at %, the effect of addition will be lost, and, if the additive content exceeds 30 at %, the mechanical strength will diminish due to the deterioration in the density of the sintered compact, and problems such as fractures occurring in the production process or sputtering process will arise.

Further, the Sb—Te-based alloy sintered compact sputtering target of the present invention may contain, as an accessory component, one or more elements selected from Ag, In, Si, Ge, Ga, Ti, Au, Pt, and Pd in an amount up to 30 at %. In order to yield the additive effect, the additive amount is usually set to 15 at % or higher. The Sb content is also added at 15 to 30 at %, and the remnant is Te.

When including, as an additive element, one or more elements selected from Ag, In, Si, Ge, Ga, Ti, Au, Pt, and Pd in an amount up to 30 at %, it is possible to obtain the intended glass transition point or transformation speed. In particular, a target formed from Ag—In—Sb—Te alloy or Ge—Sb—Te alloy containing carbon or boron is an effective component for forming the phase change recording layer.

Moreover, with the Sb—Te-based alloy sintered compact sputtering target of the present invention, the average deflective strength is preferably 100 MPa or higher. An average deflective strength being 100 MPa or higher is an indicative target for the mechanical strength to be attained with ceramics, and also become a target for reducing the generation of particles. The present invention is able to achieve the foregoing numerical value.

In addition, by increasing the purity of the Sb—Te-based alloy sintered compact sputtering target, impurities other than the primary component or the additive accessory component such as oxides will become the source of abnormal discharge (arcing).

The present invention has a purity of 4N or higher and is capable of effectively preventing the arcing caused by such impurities, and even inhibiting the generation of particles caused by such arcing. Desirably, the purity is 5N or higher.

Desirably, the content of gas components as impurities is set to 1500 ppm or less. The inclusion of gas components such as oxygen, nitrogen, and carbon could easily become the cause of the generation of impurities such as oxides, nitrides and carbides. The reduction of the foregoing impurities will lead to the prevention of arcing, and the inhibition of the generation of particles caused by such arcing.

As described above, with the Sb—Te-based alloy sintered compact of the present invention, since it is possible to inhibit the coarsening of the added carbon or boron which is nonmetal, it yields a superior effect of preventing abnormal discharge with such carbon or boron as the source, and inhibit the generation of particles caused by arcing. It is thereby possible to improve the uniformity of the sputtered thin film.

Moreover, although machining such as cutting work is performed at the stage of finishing the target, if there is coarsened carbon or boron, there is a possibility that cracks and the like will occur with such carbon or boron as the source, and the generation of particles with cracks as the source could also be considered, and the present invention is able to achieve a considerable effect of being able to prevent the foregoing problems from occurring.

As described above, the phase change target having a crystal structure according to the present invention yields the effect of being able to reduce the surface unevenness caused by the sputter erosion, and inhibit the generation of particles caused by the redeposition detachment onto the target surface. Moreover, with the foregoing structure, there is also an advantage in that the composition variation of the sputtered film in the plane and between lots can be inhibited, and the quality of the phase change recording layer can be stabilized. Additional effects are yielded in that the generation of particles, abnormal discharge and nodules can be effectively inhibited in the sputtering process as described above, and the uniformity of the thin film can be improved.

With the Sb—Te-based sputtering target of the present invention, the content of gas components such as oxygen may be additionally set to 1500 ppm or less, preferably to 1000 ppm or less, and more preferably to 500 ppm or less. The reduction of gas components such as oxygen yields an advantage in being able to further reduce the generation of particles and abnormal discharge.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

Ge, Sb, Te powder raw materials respectively having a purity of 4N or higher excluding gas components were mixed and synthesized to achieve a $Ge_{22.2}Sb_{22.2}Te_{55.6}$ alloy and this alloy raw material was pulverized with a jet mill pulverizer in an argon inert atmosphere. Powder (P) having an average diameter of 3 μm or less was thereby obtained.

Subsequently, carbon powder (C) having a grain size of 20 to 750 nm was mixed with the powder (P) at the prescribed mixing ratios (0.1 to 30 at %) shown in Table 1 using a mortar, a planetary ball mill, and a vibrational mill.

This mixing ratio must be set within an appropriate range. If this is deviated; that is, if the mixing ratio is less than 0.1 at %, there will be no effect of adding the carbon powder (C). Contrarily, if the addition exceeds 30 at %, the mechanical strength will diminish due to the deterioration in the density of the sintered compact, and problems such as fractures occurring in the production process or sputtering process will arise.

TABLE 1

| Example 1 | Amount of Carbon Powder (at %) | Method to Mix Alloy |
|---|---|---|
| 1-1 | 0.1 | mortar |
| 1-2 | 0.13 | mortar |
| 1-3 | 0.15 | mortar |
| 1-4 | 0.18 | mortar |
| 1-5 | 0.3 | mortar |
| 1-6 | 0.4 | mortar |
| 1-7 | 0.5 | mortar |
| 1-8 | 15 | mortar |
| 1-9 | 30 | mortar |
| 1-10 | 0.15 | planetary ball mill |
| 1-11 | 0.5 | planetary ball mill |
| 1-12 | 15 | planetary ball mill |
| 1-13 | 0.15 | vibrational mill |
| 1-14 | 0.5 | vibrational mill |
| 1-15 | 15 | vibrational mill |

Subsequently, among the powders mixed as described above, the raw material powders in which the grain size ratio of the respective powders (Y/X) was changed as shown in Table 2 based on the composition ratio of Example 1-3 (the amount of carbon powder: 0.15 at %) were sintered by way of hot pressing, and the obtained sintered compact was subject to machining and polishing to obtain a $Ge_{22.2}Sb_{22.2}Te_{55.6}$ alloy target containing the foregoing prescribed amount of carbon. Here, X is the average crystal grain size of the $Ge_{22.2}Sb_{22.2}Te_{55.6}$ alloy particles and Y to is the average grain size of carbon. The obtained sputtering target comprised a uniform mixed structure of Sb—Te-based alloy particles and fine carbon (C) particles.

In the foregoing case, it was possible to achieve the following; specifically, the average grain size of the $Ge_{22.2}Sb_{22.2}Te_{55.6}$ alloy particles was 3 μm or less and the standard deviation thereof was less than 1.00, and the average grain size of C was 0.5 μm or less and the standard deviation thereof was less than 0.20.

It is important that Y/X is within the range of 0.1 to 0.5. Table 2 shows the density of the target of this Example when the amount of the carbon powder mixed with mortar was 0.15 at %.

Since carbon easily becomes a cluster, if the mixed state is insufficient, there is a problem in that lumps will be generated. Thus, a uniform mixture is important, and Y/X must be within the range of 0.1 to 0.5 as a means for achieving such uniform mixture.

As shown in Table 2, the density of the targets of Example 1-16 to Example 1-25 was 98.51% to 99.99%, and the number of generated particles of 0.3 μm or larger was few at 26 to 50.

TABLE 2

| Example 1 | Ratio Y/X of Target | Relative Density of Target | Number of Particles 0.3 μm or larger |
|---|---|---|---|
| 1-16 | 0.101 | 99.99% | 26 |
| 1-17 | 0.120 | 99.96% | 28 |
| 1-18 | 0.133 | 99.95% | 28 |
| 1-19 | 0.139 | 99.93% | 29 |
| 1-20 | 0.145 | 99.94% | 30 |
| 1-21 | 0.159 | 99.94% | 33 |
| 1-22 | 0.213 | 99.90% | 37 |
| 1-23 | 0.254 | 99.98% | 40 |
| 1-24 | 0.326 | 99.93% | 46 |

TABLE 2-continued

| Example 1 | Ratio Y/X of Target | Relative Density of Target | Number of Particles 0.3 µm or larger |
|---|---|---|---|
| 1-25 | 0.497 | 99.91% | 50 |
| Comparison 1-A | 0.608 | 97.50% | 81 |
| Comparison 1-B | 0.811 | 96.51% | >100 |

Comparative Example 1

As a comparative example, the raw material of Example 1-3 was used, and Y/X was adjusted to be 0.608 and 0.811, which is outside of the range of 0.1 to 0.5, and a $Ge_{22.2}Sb_{22.2}Te_{55.6}$ alloy target was prepared as with Example 1.

As shown in table 2, the density of the targets of comparison 1-A and Comparison 1-B became 97.50% and 96.51% and deteriorated compared to Example 1. The number of generated particles increased to 81 and more than 100 respectively, and showed inferior results.

Thus, in cases where Y/X exceeds 0.5, the effect of inhibiting the generation of arcing and particles is low and the sinterability is inferior, and problems such as fractures occurred due to the low density. While, in cases where Y/X is less than 0.1, producing the target was difficult since the carbon powder will fall below the minimum size in which such powder can be separated and dispersed with this technology.

The SEM photograph of the target structure of Example 1-16 is shown in FIG. 1. As shown, defects such as cracks could not be observed at all, and the target comprised a structure in which fine carbon particles encompass the periphery of the $Ge_{22.2}Sb_{22.2}Te_{55.6}$ alloy particles. The number of generated particles of 0.3 µm or larger which were formed on a 200 mmφ Si wafer upon performing sputtering up to 100 kWhr was 26 as described above, and a superior target was obtained.

The SEM photograph of the target structure of Comparative Example 1-A is shown in FIG. 2. In FIG. 2, there is a dappled structure at the center and upper left part, and "lumps" of coarsened carbon can be observed. When using the target having the structure shown in FIG. 2, as illustrated in foregoing Comparative Example 1-A, the number of generated particles of 0.3 µm or larger formed on the 200 mmφ Si wafer increased to 81, and showed clearly inferior results.

FIG. 3 shows the mechanical strength of the Ge—Sb—Te alloy of Example 1 and Comparative Example 1 upon adding 15 at % of C. In the chart of FIG. 3, it can be said that the farther it is to the right side, the higher strength (high deflective strength) the material has. The average deflective strength can be obtained by multiplying the respective values of the deflective strength and dividing it by the number of samples.

The vertical axis in FIG. 3 shows the estimated probability of fatigue failure which is obtained by dividing the number of samples prepared from the same specimen by 1. For example, if there are 4 specimens, the 4 points of 0.25, 0.50, 0.75, and 1.00 can be plotted.

In the examples of Comparison 1-A and Comparison 1-B in FIG. 3, since the grain size of Carbon is relatively greater, each line of the deflective strength is to the left side in the chart and shows a weak value.

Meanwhile, Example 1-18, Example 1-21, and Example 1-24 show that the smaller the grain size of carbon becomes, the more uniform is the dispersion thereof and the more mechanical strength it has.

Example 2

As with Example 1 above, Ge, Sb, Te powder raw materials respectively having a purity of 4N or higher excluding gas components were mixed and synthesized to achieve a $Ge_{22.2}Sb_{22.2}Te_{55.6}$ alloy, and this alloy raw material was pulverized with a jet mill pulverizer in an argon inert atmosphere. Powder (P) having an average diameter of 3 µm or less was thereby obtained.

Subsequently, boron powder (B) having a grain size of 20 to 750 nm was mixed with the powder (P) at the mixing ratios (0.1 to 30 at %) shown in Table 3 using a mortar, a planetary ball mill, and a vibrational mill.

This mixing ratio must be set within an appropriate range. If this is deviated; that is, if the mixing ratio is less than 0.1 at %, there will be no effect of adding the boron powder (B). Contrarily, if the addition exceeds 30 at %, the mechanical strength will diminish due to the deterioration in the density of the sintered compact, and problems such as fractures occurring in the production process or sputtering process will arise.

TABLE 3

| Example 2 | Amount of Boron Powder (at %) | Method to Mix Alloy with |
|---|---|---|
| 2-1 | 0.1 | mortar |
| 2-2 | 0.13 | mortar |
| 2-3 | 0.15 | mortar |
| 2-4 | 0.18 | mortar |
| 2-5 | 0.2 | mortar |
| 2-6 | 0.27 | mortar |
| 2-7 | 0.33 | mortar |
| 2-8 | 0.8 | mortar |
| 2-9 | 1.5 | mortar |
| 2-10 | 15 | mortar |
| 2-11 | 30 | mortar |
| 2-12 | 0.25 | planetary ball mill |
| 2-13 | 0.8 | planetary ball mill |
| 2-14 | 15 | planetary ball mill |
| 2-15 | 0.17 | vibrational mill |
| 2-16 | 0.8 | vibrational mill |
| 2-17 | 3 | vibrational mill |
| 2-18 | 15 | vibrational mill |

Subsequently, among the powders mixed as described above, the raw material powders in which the grain size ratio of the respective powders (Y/X) was changed as shown in Table 4 based on the composition ratio of Example 2-10 (15 at % boron powder) were sintered by way of hot pressing, and the obtained sintered compact was subject to machining and polishing to obtain a $Ge_{22.2}Sb_{22.2}Te_{55.6}$ alloy target containing the foregoing prescribed amount of boron. Here, X is the average grain size of the $Ge_{22.2}Sb_{22.2}Te_{55.6}$ alloy particles and Y is the average grain size of boron. These will be Example 2-19 to Example 2-28.

The obtained sputtering targets all comprised a uniform mixed structure of Sb—Te-based alloy particles and boron (B) particles.

In the foregoing case, it was possible to achieve the following; specifically, the average crystal grain size of the $Ge_{22.2}Sb_{22.2}Te_{55.6}$ alloy particles was 3 µm or less and the standard deviation thereof was less than 1.00, and the average grain size of B was 0.5 µm or less and the standard deviation thereof was less than 0.20.

Moreover, when the average grain size of the $Ge_{22.2}Sb_{22.2}Te_{55.6}$ alloy particles is X and the average grain size of boron is Y, it is important that Y/X is within the range of 0.1 to 0.5. Table 4 shows the density of the target of this Example when the amount of the boron powder mixed with mortar was 15 at %.

Since fine boron, as with carbon, easily becomes a cluster, if the mixed state is insufficient, there is a problem in that lumps will be generated. Thus, a uniform mixture is important, and Y/X must be within the range of 0.1 to 0.5 as a means for achieving such uniform mixture.

Upon observing the SEM photograph of the target surface of Example 2-19 obtained as described above, it was similar to FIG. 1. Defects such as cracks could not be observed at all, and the target comprised a structure in which fine boron particles encompass the periphery of the $Ge_{22.2}Sb_{22.2}Te_{55.6}$ alloy particles.

The number of generated particles of 0.3 μm or larger which were formed on a 200 mmφ Si wafer upon performing sputtering up to 100 kWhr was 28 to 66, and a superior target was obtained. The results are shown in Table 4.

Comparative Example 2

As a comparative example, the raw material of Example 2-10 was used, and when the average grain size of the Sb—Te-based alloy particles is X and the average grain size of boron is Y, Y/X was adjusted to be 0.610 and 0.792, which is outside of the range of 0.1 to 0.5, and a $Ge_{22.2}Sb_{22.2}Te_{55.6}$ alloy target was prepared as with Example 2.

As shown, the density of the targets of Comparison 2-A and Comparison 2-B became 97.13% and 96.36% and deteriorated compared to Example 2. The number of generated particles of 0.3 μm or larger increased to 83 and more than 100 respectively, and showed clearly inferior results.

Thus, in cases where Y/X exceeds 0.5, the effect of inhibiting the generation of arcing and particles is low and the sinterability is also inferior, and problems such as fractures occurred due to the low density. While, in cases where Y/X is less than 0.1, producing the target was difficult since the boron powder will fall below the minimum size in which such powder can be separated and dispersed with this technology.

Upon observing SEM photograph of the target, in the cases where Y/X exceeds 0.5 and Y/X is 0.610, "lumps" of coarsened boron can be observed, which was similar to FIG. 2.

TABLE 4

| Example 2 | Ratio Y/X of Target | Relative Density of Target | Number of Particles 0.3 μm or larger |
|---|---|---|---|
| 2-19 | 0.109 | 99.96% | 28 |
| 2-20 | 0.118 | 99.94% | 30 |
| 2-21 | 0.127 | 99.94% | 31 |
| 2-22 | 0.140 | 99.92% | 32 |
| 2-23 | 0.142 | 99.93% | 35 |
| 2-24 | 0.163 | 99.92% | 40 |
| 2-25 | 0.221 | 99.72% | 44 |
| 2-26 | 0.267 | 99.46% | 50 |
| 2-27 | 0.335 | 98.95% | 59 |
| 2-28 | 0.493 | 98.29% | 66 |
| Comparison 2-A | 0.610 | 97.13% | 83 |
| Comparison 2-B | 0.792 | 96.36% | >100 |

Example 3—Part of Comparative Example 3

In, Sb, Te powder raw materials respectively having a purity of 4N or higher excluding gas components were mixed and synthesized to achieve an $In_{22.2}Sb_{22.2}Te_{55.6}$ alloy, and this alloy raw material was pulverized with a jet mill pulverizer in an argon inert atmosphere. Powder (P) having an average diameter of 3 μm or less was thereby obtained.

Subsequently, carbon powder (C) and boron powder (B) having a grain size of 7 to 750 nm was mixed with the powder (P) at the mixing ratios (0.1 to 30 at %) shown in Table 5 using a mortar.

This mixing ratio must be set within an appropriate range. If this is deviated; that is, if the mixing ratio is less than 0.1 at %, there will be no effect of adding the carbon powder (C) and boron powder (B). Contrarily, if the addition exceeds 30 at %, the mechanical strength will diminish due to the deterioration in the density of the sintered compact, and problems such as fractures occurring in the production process or sputtering process will arise.

TABLE 5

| Example 3 | Amount of Carbon and Boron Powder (at %) | Method to Mix Alloy with |
|---|---|---|
| 3-1 | C: 0.05 B: 0.05 | mortar |
| 3-2 | C: 0.15 B: 0.15 | mortar |
| 3-3 | C: 0.4 B: 0.4 | mortar |
| 3-4 | C: 15 B: 15 | mortar |

Subsequently, among the powders mixed as described above, the raw material powders in which the grain size ratio of the respective powders (Y/X) was changed as shown in Table 6 based on the composition ratio of Example 3-4 (the amount of carbon powder and boron powder was 15 at % respectively and 30 at % in total) were sintered by way of hot pressing, and the obtained sintered compact was subject to machining and polishing to obtain an $In_{22.2}Sb_{22.2}Te_{55.6}$ alloy target containing the foregoing prescribed amount of carbon or boron. Here, X is the average grain size of the $In_{22.2}Sb_{22.2}Te_{55.6}$ alloy particles and Y is the average grain size of mixed powder of carbon and boron.

The obtained Sb—Te-based alloy sintered compact sputtering target comprised a uniform mixed structure of Sb—Te-based alloy particles and fine carbon (C) or boron (B) particles.

In the foregoing case, it was possible to achieve the following; specifically, the average grain size of the $In_{22.2}Sb_{22.2}Te_{55.6}$ alloy particles was 3 μm or less and the standard deviation thereof was less than 1.00, and the average grain size of C or B was 0.5 μm or less and the standard deviation thereof was less than 0.20.

It is important that Y/X is within the range of 0.1 to 0.5. Table 6 shows the Y/X ratio of the target and the density of the target of this Example when the amount of the carbon powder 15 at % and the boron powder 15 at % was mixed with mortar.

As shown in Table 6, the density of Example 3-5 to Example 3-14 is 97.85% to 98.35%; high density targets were obtained.

Since fine carbon and boron easily become a cluster, if the mixed state is insufficient, there is a problem in that lumps will be generated. Thus, a uniform mixture is important, and Y/X must be within the range of 0.1 to 0.5 as a means for achieving such uniform mixture. Consequently, in cases where Y/X exceeds 0.5, the effect of inhibiting the generation of arcing and particles is low and the sinterability is also inferior, and problems such as fractures occurred due to the low density. While, in cases where Y/X is less than 0.1, producing the target was difficult since the carbon powder and boron powder will fall below the minimum size in which such powder can be separated and dispersed with this technology.

TABLE 6

| Example 3 | Ratio Y/X of Target | Relative Density of Target | Number of Particles 0.3 μm or larger |
|---|---|---|---|
| 3-5 | 0.103 | 98.35% | 46 |
| 3-6 | 0.115 | 98.26% | 47 |
| 3-7 | 0.129 | 98.19% | 49 |
| 3-8 | 0.138 | 98.21% | 51 |
| 3-9 | 0.146 | 98.16% | 54 |
| 3-10 | 0.160 | 98.10% | 57 |
| 3-11 | 0.225 | 98.03% | 63 |
| 3-12 | 0.261 | 97.95% | 68 |
| 3-13 | 0.328 | 97.92% | 71 |
| 3-14 | 0.494 | 97.85% | 75 |
| Comparison 3-A | 0.614 | 96.62% | >100 |
| Comparison 3-B | 0.789 | 95.51% | >100 |

Upon observing SEM photograph of the target surface of Example 3-5 obtained as described above, as with Example 1-16, defects such as cracks could not be observed at all, and the target comprised a structure in which fine carbon or boron particles encompass the periphery of the $In_{22.2}Sb_{22.2}Te_{55.6}$ alloy particles.

As Comparative Examples, Comparison 3-A and Comparison 3-B are shown in Table 6. Upon observing SEM photograph of the target in which Y/X exceeded 0.5 and Y/X was 0.614 in Table 6, there was a dappled structure and "lumps" of coarsened carbon or boron could be observed. The density of Comparison 3-A and Comparison 3-B was 96.62% and 95.51% respectively, was lower compared to Examples.

In Example 3, the number of generated particles of 0.3 μm or larger which were formed on a 200 mmφ Si wafer was 46 to 75, and a superior target was obtained though the amount of carbon and boron was high.

When using the target of the Comparative Examples in which Y/X exceeded ½, and when Y/X was 0.614 and Y/X was 0.789, the number of generated particles of 0.3 μm or larger formed on the 200 mmφ Si wafer increased to more than 100 and showed clearly inferior results.

Example 4—Part of Comparative Example 4

Ag, In, Sb, Te powder raw materials respectively having a purity of 4N or higher excluding gas components were mixed and synthesized to achieve an $Ag_5In_5Sb_{70}Te_{20}$ alloy, and this alloy raw material was pulverized with a jet mill pulverizer in an argon inert atmosphere. Powder (P) having an average diameter of 3 μm or less was thereby obtained.

Subsequently, carbon powder (C) and boron powder (B) having a grain size of 20 to 750 nm was mixed with the powder (P) at the mixing ratios (0.1 to 30 at %) shown in Table 7 using a mortar.

This mixing ratio must be set within an appropriate range. If this is deviated; that is, if the mixing ratio is less than 0.1 at %, there will be no effect of adding the carbon powder (C) and boron powder (B). Contrarily, if the addition exceeds 30 at %, the mechanical strength will diminish due to the deterioration in the density of the sintered compact, and problems such as fractures occurring in the production process or sputtering process will arise.

TABLE 7

| Example 4 | Amount of Carbon and Boron Powder (at %) | Method to Mix Alloy with |
|---|---|---|
| 4-1 | C: 0.05 B: 0.05 | mortar |
| 4-2 | C: 0.15 B: 0.15 | mortar |
| 4-3 | C: 0.4 B: 0.4 | mortar |
| 4-4 | C: 15 B: 15 | mortar |

The powders mixed as described above were sintered by way of hot pressing, and the obtained sintered compact was subject to machining and polishing to obtain an $Ag_5In_5Sb_{70}Te_{20}$ alloy target containing the foregoing prescribed amount of carbon or boron. The obtained Sb—Te-based alloy sintered compact sputtering target containing 0.1 to 30 at % of carbon and boron comprised a uniform mixed structure of Sb—Te-based alloy particles and fine carbon (C) and boron (B) particles.

In the foregoing case, it was possible to achieve the following; specifically, the average grain size of the $Ag_5In_5Sb_{70}Te_{20}$ alloy particles was 3 μm or less and the standard deviation thereof was less than 1.00, and the average grain size of C or B was 0.5 μm or less and the standard deviation thereof was less than 0.20.

When the average grain size of the $Ag_5In_5Sb_{70}Te_{20}$ alloy particles is X and the average grain size of carbon and boron is Y, it is important that Y/X is within the range of 0.1 to 0.5.

Table 8 shows the Y/X ratio of the target and the density of the target when the amount of boron powder is 15 at %, carbon powder is 15 at % and 30 at % in total as with this Example mixed with mortar. The density of Example 4-5 to Example 4-14 was within the range of 97.80% to 98.25%.

Fine carbon or boron easily becomes a cluster. If the mixed state is insufficient; there is a problem in that lumps will be generated. Thus, a uniform mixture is important, and Y/X must be within the range of 0.1 to 0.5 as a means for achieving such uniform mixture.

As Comparative Examples, Comparison 4-A and Comparison 4-B are shown in Table 8. The relative density of the respective Comparison 4-A and Comparison 4-B is 96.52% and 95.40%; was low compared to Examples. Consequently, in cases where Y/X exceeds 0.5, the effect of inhibiting the generation of arcing and particles is low and the sinterability is also inferior, and problems such as fractures occurred due to the low density.

In cases where Y/X is less than 0.1, producing the target was difficult since the carbon powder or boron powder will fall below the minimum size in which such powder can be separated and dispersed with this technology.

TABLE 8

| Example 4 | Ratio Y/X of Target | Relative Density of Target | Number of Particles 0.3 μm or larger |
|---|---|---|---|
| 4-5 | 0.102 | 98.25% | 47 |
| 4-6 | 0.123 | 98.21% | 40 |
| 4-7 | 0.130 | 98.15% | 52 |
| 4-8 | 0.134 | 98.13% | 55 |
| 4-9 | 0.143 | 98.13% | 59 |
| 4-10 | 0.155 | 98.10% | 62 |
| 4-11 | 0.231 | 97.97% | 66 |
| 4-12 | 0.249 | 97.91% | 72 |
| 4-13 | 0.319 | 97.83% | 74 |
| 4-14 | 0.499 | 97.80% | 75 |
| Comparison 4-A | 0.613 | 96.52% | >100 |
| Comparison 4-B | 0.804 | 95.40% | >100 |

Upon observing the SEM photograph of the target surface of Example 4-5 obtained as described above, as with Example 1-16, defects such as cracks could not be observed at all, and the target comprised a structure in which fine boron particles encompass the periphery of the $Ge_{22.2}Sb_{22.2}Te_{55.6}$ alloy particles.

Upon observing the SEM photograph of the targets of Comparative Example 4 in which Y/X was 0.613 and Y/X thereof exceeded 0.5, there was a dappled structure and "lumps" of coarsened carbon or boron could be observed.

In Example 4, the number of generated particles of 0.3 μm or larger which were formed on a 200 mmφ Si wafer upon performing sputtering up to 100 kWhr was 47 or 75, and a superior target was obtained even though the amount of carbon and boron powder that was mixed is higher.

When using the target of Comparison 4-A and Comparison 4-B in which Y/X exceeded 0.5, and when Y/X was 0.614 in Comparison 4-A, the number of generated particles of 0.3 μm or larger formed on the 200 mmφ Si wafer increased to more than 100, and showed clearly inferior results. When using the target of Comparison 4-B in which Y/X was 0.804, the number of generated particles of 0.3 μm or larger formed on the 200 mmφ Si wafer increased to more than 100, and showed inferior results.

The Examples explain a case of using the $Ge_{22.2}Sb_{22.2}Te_{55.6}$ alloy target, the $In_{22.2}Sb_{22.2}Te_{55.6}$ alloy and the $Ag_5In_5Sb_{70}Te_{20}$ alloy target to which carbon or boron was added. The same effects were yielded in the addition of carbon or boron when adding, as an accessory component, one or more elements selected from Ag, In, Si, Ge, Ga, Ti, Au, Pt, and Pd.

That is, one or more elements selected from Ag, In, Si, Ge, Ga, Ti, Au, Pt, and Pd to become the additive component are equivalent in a material generally referred to as an Sb—Te-based alloy material for use as a phase change recording film, and can be considered equivalents. Accordingly, the foregoing elements yield the same effects without having to describe them in the Examples. The same applies to the Sb—Te-based alloy sintered compact sputtering target of the present invention.

With the Sb—Te-based alloy sintered compact of the present invention, since it is possible to inhibit the coarsening of the grain size of the Sb—Te-based alloy and the added carbon or boron which is nonmetal, it yields a superior effect of being able to prevent abnormal discharge with such carbon or boron as the source, inhibit the generation of particles caused by arcing, and improve the uniformity of the thin film. Moreover, although machining such as cutting work is performed at the stage of finishing the target, if there is coarsened carbon or boron, there is a possibility that cracks and the like will occur with such carbon or boron as the source, and the generation of particles with cracks as the source could also be considered, and the present invention is able to achieve a considerable effect of being able to prevent the foregoing problems from occurring. Thus, the present invention is extremely effective for use as a phase change recording material; that is, as a medium for recording information by using phase transformation.

We claim:

1. An Sb—Te-based alloy sputtering target having a composition containing Sb and Te as main constituent elements thereof and carbon or boron in an amount of more than 10 at % and equal to or less than 30 at %, having a relative density of 97.85% or more, and having an average deflective strength of 100 MPa or higher, wherein the Sb—Te-based alloy sputtering target has a uniform structure comprising grains of an Sb—Te-based alloy phase and a uniform dispersion of grains of the carbon or boron, the grains of the Sb—Te-based alloy phase have an average size of 3 μm or less and a standard deviation of less than 1.00, the grains of the carbon or boron have an average size of 0.5 μm or less and a standard deviation of less than 0.20, and, for the average size of the grains of the Sb—Te-based alloy phase expressed by X and the average size of the grains of the carbon or boron expressed by Y, a ratio Y/X is within a range of from 0.213 to 0.5.

2. The Sb—Te-based alloy sputtering target according to claim 1, containing one or more elements selected from the group consisting of Ag, In, Si, Ge, Ga, Ti, Au, Pt, and Pd in a total amount of 30 at % or less.

3. The Sb—Te-based alloy sputtering target according to claim 2, wherein the Sb—Te alloy sputtering target is an Ag—In—Sb—Te alloy or Ge—Sb—Te alloy sputtering target containing carbon or boron.

4. The Sb—Te-based alloy sputtering target according to claim 1, wherein the Sb—Te alloy sputtering target is an Ag—In—Sb—Te alloy or Ge—Sb—Te alloy sputtering target containing carbon or boron.

5. The Sb—Te-based alloy sputtering target according to claim 1, wherein the amount of carbon or boron contained in the target is 15 to 30 at %.

6. The Sb—Te-based alloy sputtering target according to claim 1, wherein the composition contains carbon in an amount of 15 to 30 at %.

7. The Sb—Te-based alloy sputtering target according to claim 1, wherein the relative density is 97.85% to 99.99%.

8. The Sb—Te-based alloy sputtering target according to claim 1, wherein the grains of the Sb—Te-based alloy phase are jet mill pulverized grains.

\* \* \* \* \*